United States Patent [19]

Yazawa et al.

[11] Patent Number: 5,960,534
[45] Date of Patent: Oct. 5, 1999

[54] ELECTRONIC-PART SURFACE MOUNTING APPARATUS

[75] Inventors: Takayuki Yazawa, Nagano; Nobuyuki Kubokawa, Ina, both of Japan

[73] Assignee: Sankyo Seiki Mfg. Co., Ltd., Nagano-ken, Japan

[21] Appl. No.: 08/929,635

[22] Filed: Sep. 15, 1997

Related U.S. Application Data

[63] Continuation of application No. 08/497,020, Jun. 30, 1995, abandoned.

[30] Foreign Application Priority Data

Jul. 6, 1994 [JP] Japan ..................................... 6-176175

[51] Int. Cl.⁶ ............................. H05K 13/04; H05K 3/30; B23P 19/00
[52] U.S. Cl. .......................... 29/743; 29/DIG. 44; 29/740
[58] Field of Search .............................. 29/740, 741, 743, 29/DIG. 44; 294/64.1; 414/737

[56] References Cited

U.S. PATENT DOCUMENTS

| | | |
|---|---|---|
| 4,706,379 | 11/1987 | Seno et al. |
| 4,872,258 | 10/1989 | Ragard . |
| 4,951,383 | 8/1990 | Amao et al. .......................... 29/743 X |
| 4,979,286 | 12/1990 | Nakayama et al. ................. 294/64.1 X |
| 5,184,397 | 2/1993 | Hidese . |

FOREIGN PATENT DOCUMENTS

| | | | |
|---|---|---|---|
| 4148599 | 5/1992 | Japan ...................................... 29/743 |
| 4345097 | 12/1992 | Japan ...................................... 29/743 |

*Primary Examiner*—Lee Young
*Assistant Examiner*—Bobby Rushing, Jr.
*Attorney, Agent, or Firm*—McAulay Nissen Goldberg Kiel & Hand, LLP

[57] ABSTRACT

An electronic-part surface mounting apparatus includes an S-Z shaft vertically movable with respect to the mounted surface of a printed circuit board on which mounted parts such as electronic parts are mounted, and rotatable in a plane parallel to the mounted surface; an arm member revolving around the S-Z shaft; a plural number of Z-shafts, supported by the arm member, being vertically movable with respect to the mounted surface; cam unit revolving around the Z-shafts to cause the Z-shafts to individually move in a reciprocating manner; attraction/mounting unit operating such that at a position where the Z-shafts come nearest to the mounted surface, the attraction/mounting unit releases the mounted part from its seizure by the absorption nozzle attached to the lower end of the Z-shaft and mounts the mounted part on the mounted surface. With one cycle of the cam unit, a plural number of Z shafts descend and ascend, so that the attracting and mounting work of the mounted part are successively carried out, thereby reducing their tact time.

8 Claims, 8 Drawing Sheets

ELECTRONIC-PART SURFACE MOUNTING APPARATUS

This is a continuation application of Ser. No. 08/497,020, filed on Jun. 30, 1995 abandoned.

BACKGROUND OF THE INVENTION a) Field of the Invention

The present invention relates to an electronic-part surface mounting apparatus. More particularly, the invention relates to an electronic-part surface mounting apparatus of the multi-shaft absorption head type which successively mounts a plural number of mounted parts, for example, electronic parts, through absorption to one mounter head.

b) Description of the Related Art

A conventional electronic-part surface mounting apparatus includes: a mounter head having a single Z-shaft with an absorption nozzle firmly attached to the end thereof, the Z-shaft being vertically movable with respect to a mounted surface and rotatable in a plane parallel to the mounted surface; and a table bearing a printed circuit board thereon being fixed or moved in the X and the Y direction. The table is operated such that when the mounter head is moved in the X and the Y direction, the printed circuit board is fixed, while when the mounter head is fixed, the printed circuit board is moved in the X and the Y direction.

To deal with a situation where a plural number of mounted parts are picked up from a plural number of part supply means and mounted on the mounted surface of a printed circuit board, the electronic-part surface mounting apparatus is designed to have an array of a plural number of mounter heads arranged side by side.

In the electronic-part surface mounting apparatus which uses the mounter heads arranged side by side, the machine size is inevitably increased. Further, the mounter head is large compared with the part supply means which may closely be arranged side by side. Therefore, when a plural number of mounter heads are arranged in a limited space, for example, only every other mounted part can be attracted and held. In other words, it is impossible to perform simultaneous attraction by all the mounter heads. Accordingly, considerable time is taken for attracting and holding the mounted parts. Further, the distance between two adjacent mounter heads of the array of those heads arranged side by side exceeds the coverage of one camera. Therefore, a camera for recognizing the position of the mounted part must be used for each of the mounted parts attached.

SUMMARY OF THE INVENTION

Accordingly, an object of the present invention is to provide an electronic-part surface mounting apparatus which can simultaneously attract and hold mounted parts from part supply means.

Another object of the present invention is to provide an electronic-part surface mounting apparatus which enables a single camera to recognize the positions of all the mounted parts held in an absorptive fashion.

To achieve the above object, there is provided an electronic-part surface mounting apparatus comprising: an S-Z shaft vertically movable with respect to the mounted surface of a printed circuit board and rotatable in a plane parallel to the mounted surface; an arm member revolving around the S-Z shaft; a plural number of Z-shafts, supported by the arm member, being vertically movable with respect to the mounted surface; cam means revolving around the Z-shafts to cause the Z-shafts to individually move in a reciprocating manner; and attraction/mounting means operating such that, at a position where the Z-shafts come nearest to the mounted surface, the attraction/mounting means releases the mounted part from its seizure by the absorption nozzle attached to the lower end of the Z-shaft, and mounts the mounted part on the mounted surface.

In the construction of the present invention, a plural number of Z-shafts are assembled into one mounter head. These -Z-shafts are individually driven by one cam means. With this, one supporting member is used for supporting the Z-shafts, so that the space between the adjacent Z-shafts may be reduced. Therefore, the Z-shafts may be arrayed in harmony with the part supply means closely arrayed around the S-Z shaft.

In the case where a plural number of part supply means are arrayed at given spatial intervals, and a plural number of Z-shafts are also arrayed at the same spatial intervals as of the array of the part supply means, mounted parts can simultaneously be picked up. In a mounting mode of the machine, the S-Z shaft is moved to and from the mounted surface, only the Z-shaft corresponding to a predetermined position on the mounted surface is vertically moved with respect to the mounted surface by the cam means. At a position where it approaches the mounted surface, a vacuum of the attraction/mounting means is removed, and the mounted part is mounted on that position on the mounted surface of the printed circuit board.

For a better understanding of the present invention, reference is made to the following description and accompanying drawings while the scope of the invention will be pointed out in the appended claims.

DETAILED DESCRIPTION OF THE INVENTION

Figure 1:
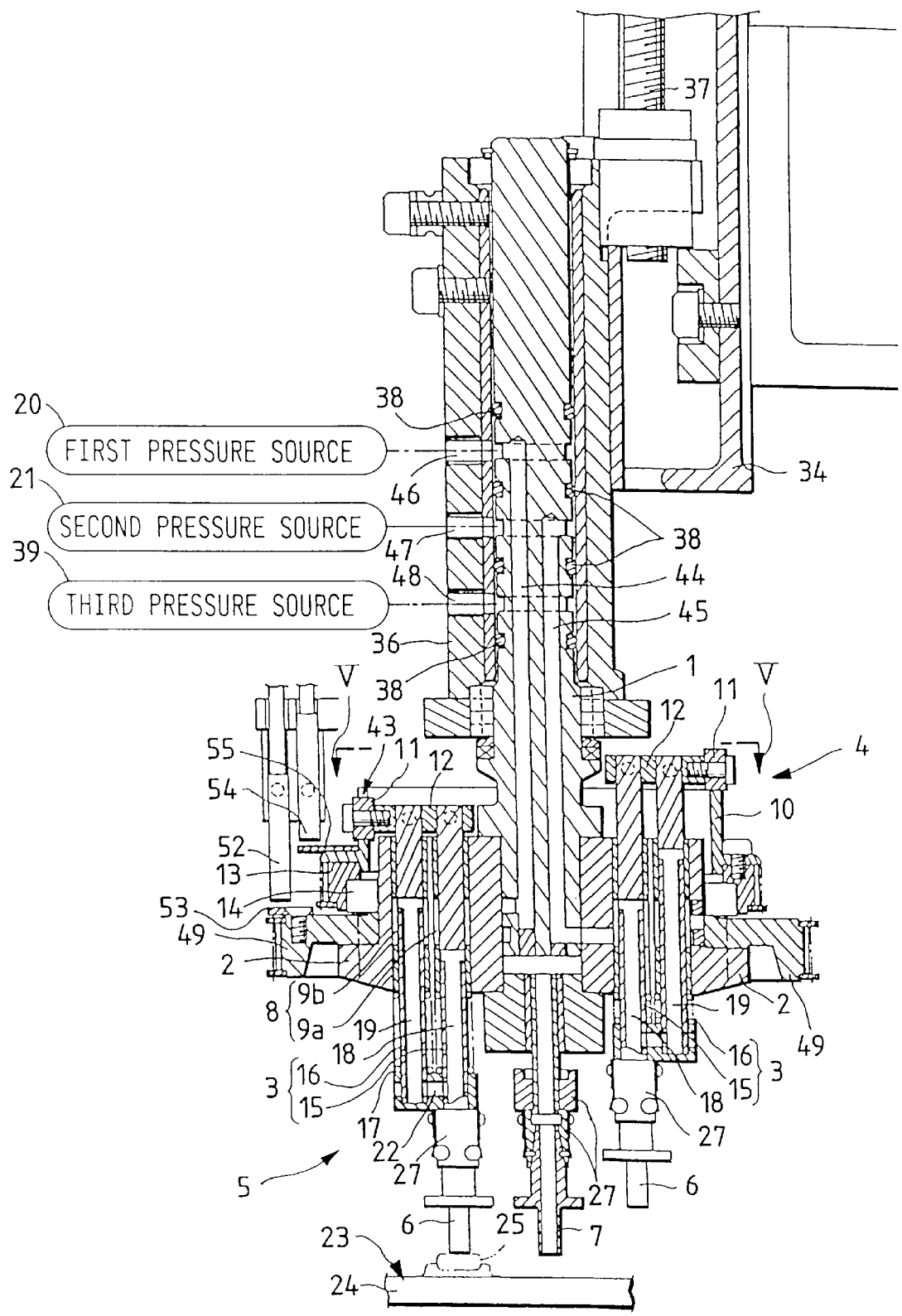
FIG. 1 is a longitudinal sectional view showing an embodiment of an electronic-part surface mounting apparatus according to the present invention.
Figure 2:
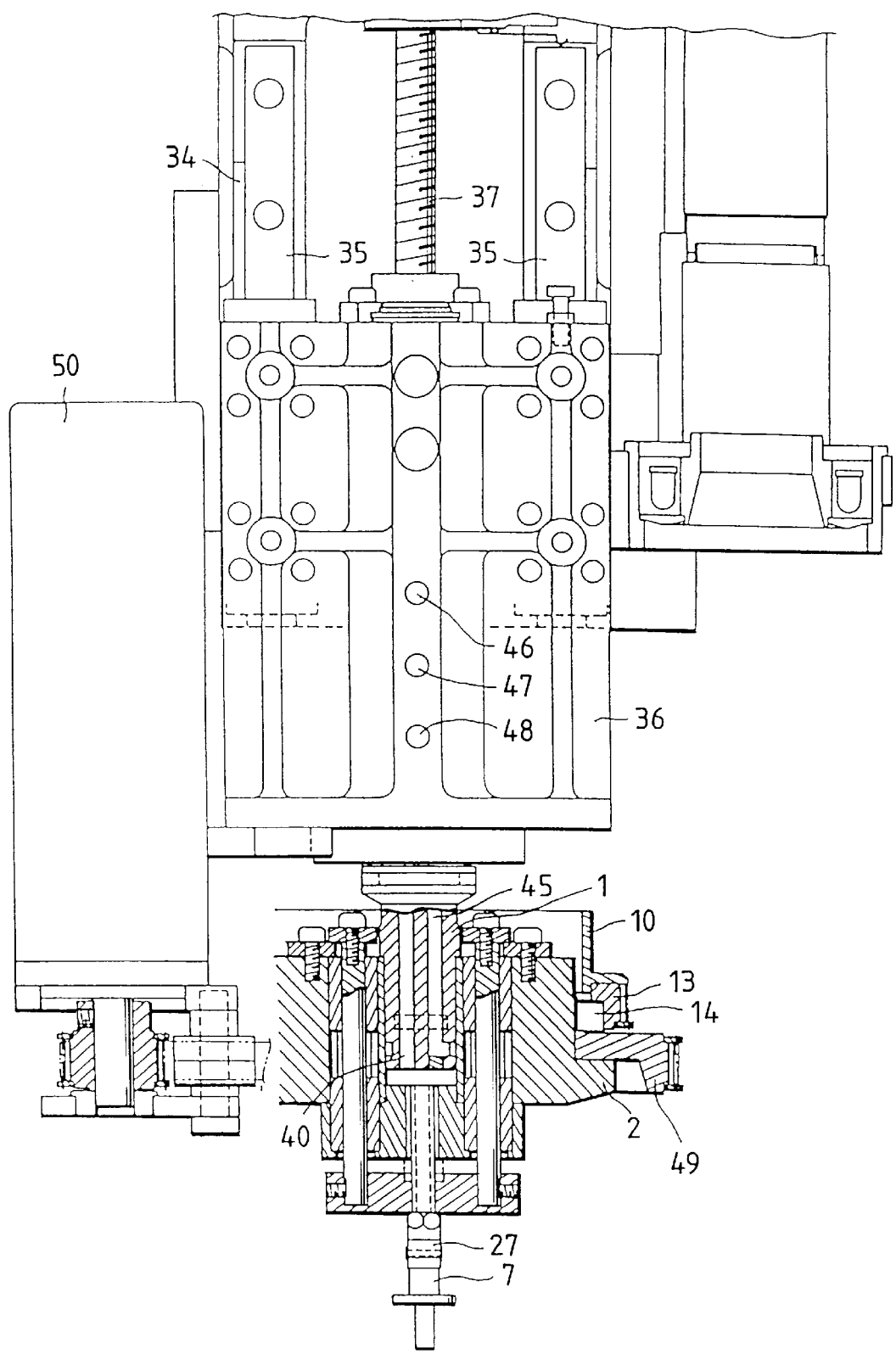
FIG. 2 is a front view, partly in cross section, showing the main part of the electronic-part surface mounting apparatus.
Figure 3:
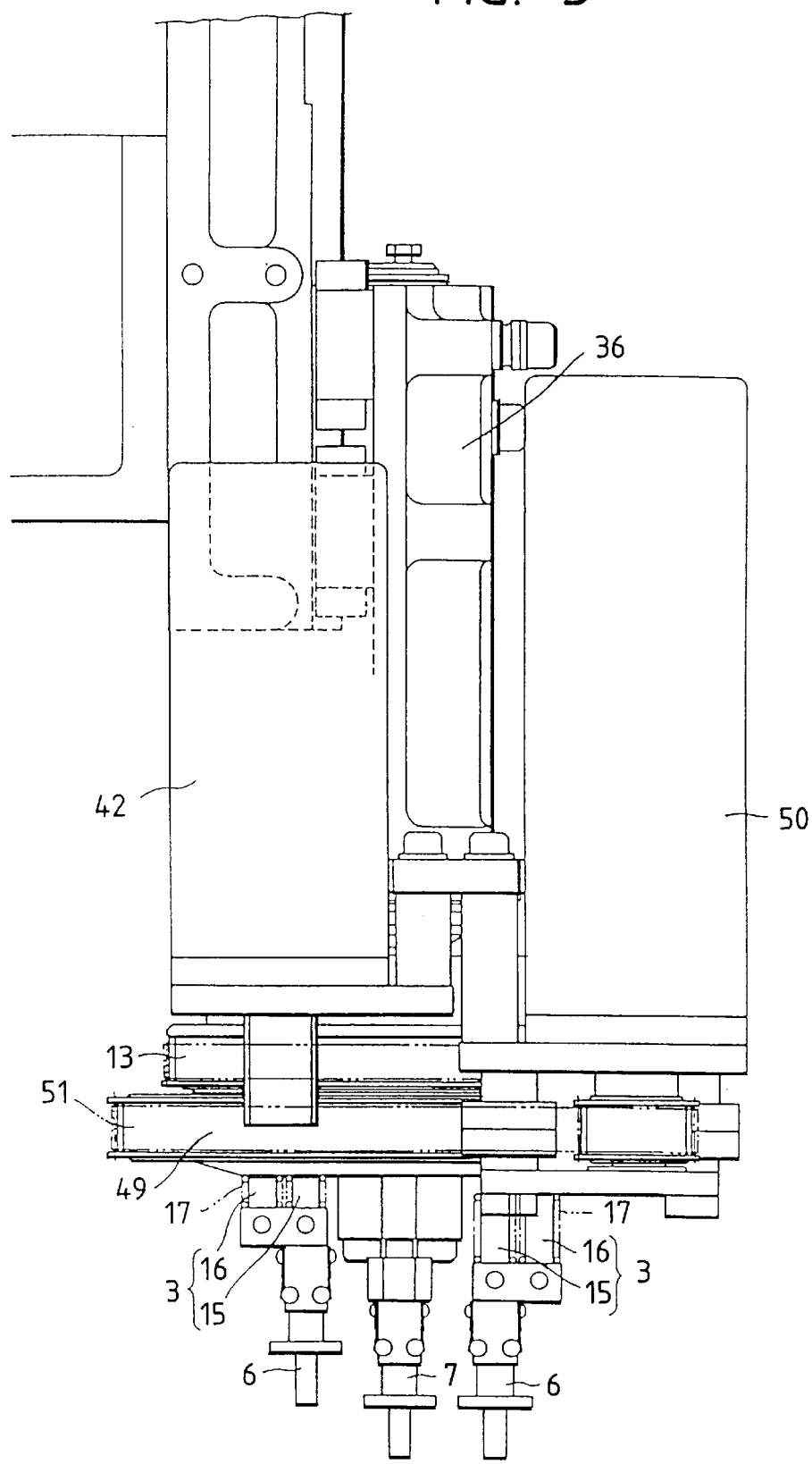
FIG. 3 is a side view showing the electronic-part surface mounting apparatus.
Figure 4:
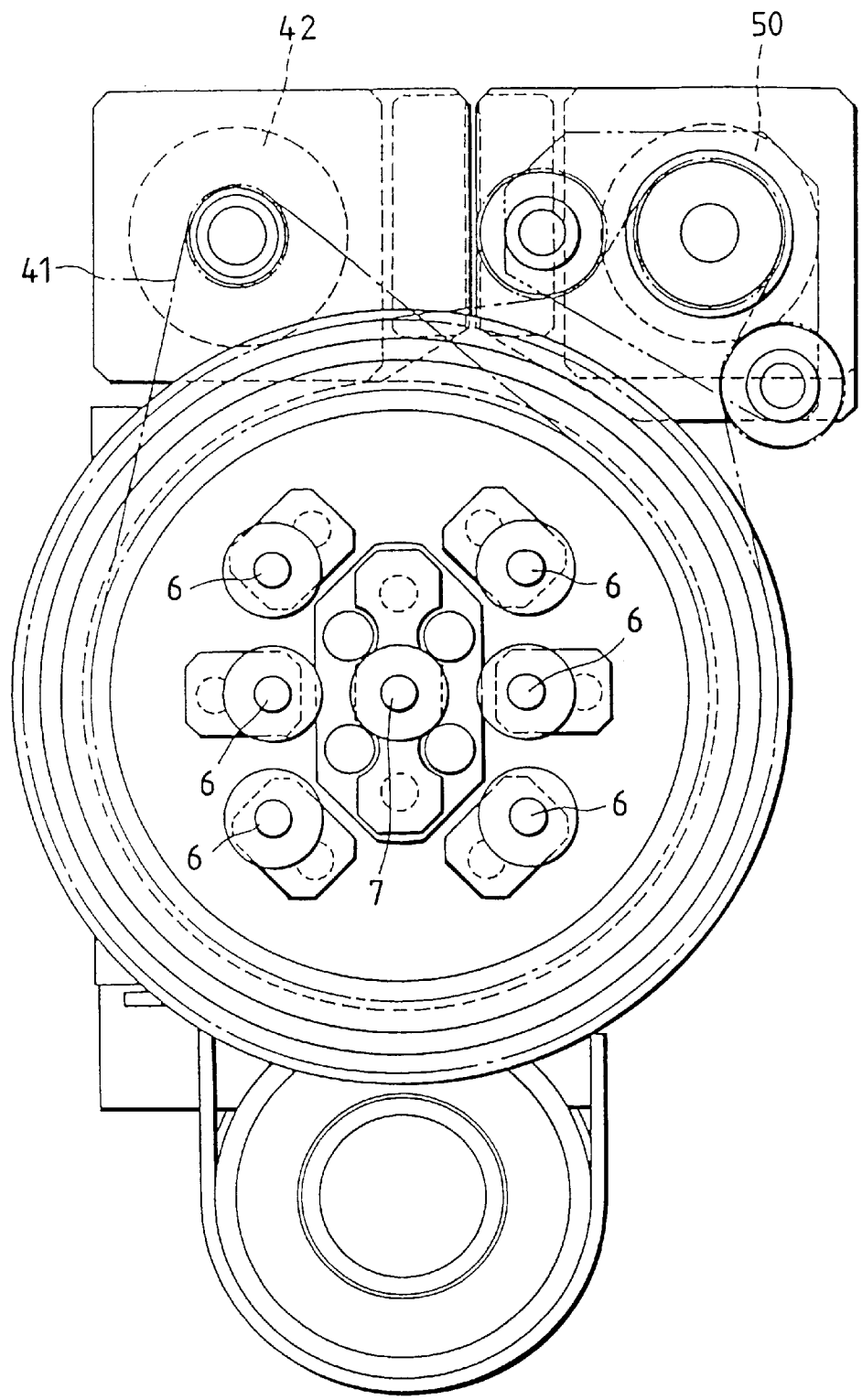
FIG. 4 is a bottom view showing the electronic-part surface mounting apparatus.

Preferred embodiments of the present invention will be described with reference to the accompanying drawings.

FIGS. 1 to 8 cooperate to illustrate an electronic-part surface mounting apparatus according to one embodiment of the present invention. The electronic-part surface mounting apparatus comprises an S-Z shaft 1, an arm member 2, a plural number of Z-shafts 3, cam means 4, and attraction/mounting means 5. The arm member 2 revolves around the S-Z shaft 1. The Z-shafts 3, supported by the arm member 2, are vertically movable with respect to the mounted surface 23. The cam means 4 revolves around the Z-shafts 3 to cause the Z-shafts 3 to vertically move with respect to the mounted surface 23. The attraction/mounting means 5 are mounted on the lower ends (as viewed in the drawings) of the S-Z shaft 1 and the Z-shafts 3, respectively.

The S-Z shaft 1, supported by an apparatus frame 34, is vertically movable with respect to the mounted surface 23 of a printed circuit board 24, and rotatable in a plane parallel to the mounted surface 23. The S-Z shaft 1 is rotatably supported by a holder 36. The holder 36 is supported by a guide 35 of the apparatus frame 34, for example, in a state that it is slidable perpendicularly (vertical to the mounted surface 23). The quantity of the linear movement in the vertical direction and the quantity of the angular movement of the holder 36 are accurately controlled by a linear ball bearing 37, which is directly controlled by a controller (not shown) of the apparatus per se. The S-Z shaft 1 contains three paths axially formed therein; a first path 44 connected to a first pressure source 20, a second path 45 connected to a second pressure source 21, and a third path 40 connected to a third pressure source 39. Three seals 38 are inserted between the holder 36 and the S-Z shaft 1, thereby forming three sealed spaces arranged in the axial direction. The ends of the three paths 44, 45 and 40 are located in and opened into those spaces. The first to third paths 44, 45 and 40 are respectively connected to the first to third pressure sources 20, 21 and 39, through ports 46, 47 and 48. The arm member 2 mounted on the lower end of the S-Z shaft 1 is turned by a motor 50 so that the S-Z shaft 1 is turned by 180°. A timing pulley 49 on which the timing belt 51 is put, is mounted on the arm member 2. The arm member 2 is coupled with the motor 50 by means of the timing belt 51. The original position of the arm member 2 is detected by the combination of a well known original position sensor 52 and a detecting plate 53.

In the arm member 2 fastened to the S-Z shaft 1, the plural number of Z-shafts 3 are disposed around the S-Z shaft 1 in a state that the Z-shafts 3 can reciprocate in the vertical direction parallel with the S-Z shaft 1. In this case, it is possible to simultaneously pick up mounted parts 25, such as electronic parts, from a plural number of part supply means 26 by absorptive attraction. In this embodiment, two sets of Z-shaft 3 are used, each set consisting of three shafts. These shafts are arrayed along lines parallel to each other. The two lines of the Z-shafts 3 are independently driven in the strokes determined by the cam means 4. This is adequate to the high speed mounting.

Attraction/mounting means 5 are mounted on the lower ends of the S-Z shaft 1 and the Z-shafts 3. The attraction/mounting means 5 of each of the Z-shafts 3 includes an absorption nozzle 6 attached to the end of the Z-shaft 3, the first and the second pressure source 20 and 21 selectively coupled with the Z-shaft 3, and a select means 8 for selecting the connection of the absorption nozzle 6 to the pressure sources 20 and 21 through the movement of the Z-shaft 3. The first pressure source 20, which is connected to the nozzle when the Z-shaft 3 ascends, generates a negative pressure when the Z-shaft 3 is used. When an absorption nozzle 7 to be described later is used, the pressure source 20 is placed in an off state (its fluid circuit is closed). The second pressure source 21, which is connected to the nozzle when the Z-shaft 3 descends, is switched in its operation mode, in the order of a negative pressure mode, an off mode, and a positive pressure mode. The attraction/mounting means 5 of the S-Z shaft 1 includes the absorption nozzle 7 attached to the lower end of the S-Z shaft 1, and the third pressure source 39, connected to the absorption nozzle 7, which is operable in any of the negative pressure mode, the off mode (the fluid circuit is closed), and the positive pressure mode. The height of the absorption nozzles 6 and the absorption nozzle 7 is controlled by the S-Z shaft 1. This is made for providing an easy close contact and to minimize an impact on the mounted part when the nozzles the mounted parts by absorption.

Figure 8:
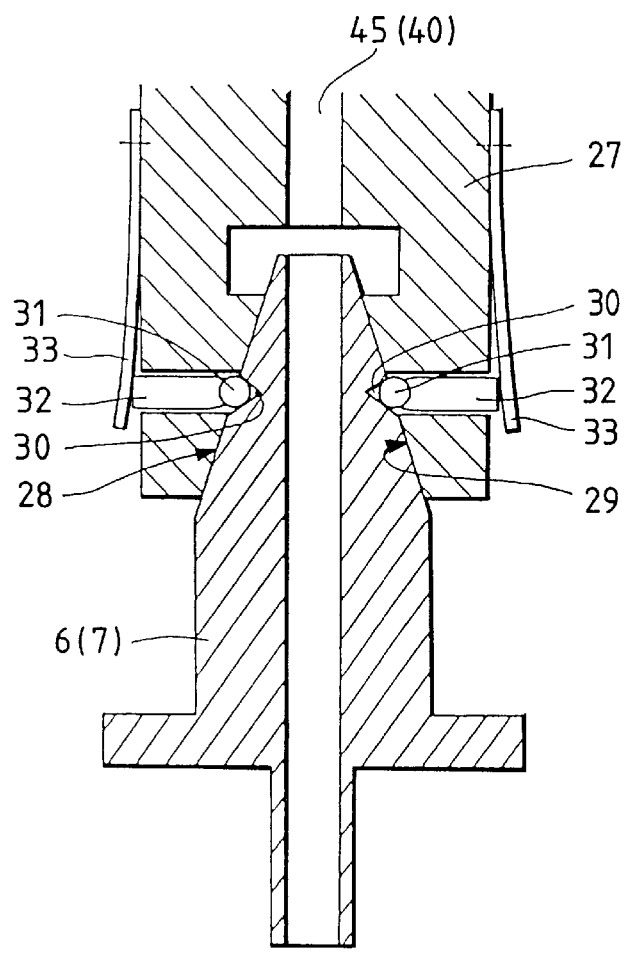
FIG. 8 is a cross sectional view showing the structure for mounting an absorption nozzle.

Each of the absorption nozzles 6 and 7 is removably inserted into a nozzle holder 27 of the corresponding shaft, viz., one of the Z-shafts 3 and the S-Z shaft 1, as best illustrated in FIG. 8. The absorption nozzle 6 (7) is clamped to the nozzle holder 27 in a manner that a tapered shank 28 of the nozzle is fit into a tapered hole 29 of the nozzle holder, and is firmly attached thereto so as not to be slipped off by means of stopper means radially inserted. The stopper means includes a V-shaped groove 30 circumferentially formed in the tapered shank 28 of the nozzle 6(7), a clamp shaft 32, and a plate spring 33 for constantly pressing the clamp shaft 32 inward. The clamp shaft 32 has a ball 31 at the tip thereof to be fit into the V-shaped groove 30, and is supported by the nozzle holder 27. The clamp shaft 32 thus supported is movable in the direction perpendicular to the direction of the movement of the tapered shank 28. The plate spring 33 is fastened to the outer surface of the nozzle holder 27 by means of screws, with its free end being pressed against the clamp shaft 32. With this structure, when the tapered shank 28 of the absorption nozzle 6 (7) is inserted into the tapered hole 29 of the nozzle holder 27, the tapered shank 28 moves therein, pushes the clamp shaft 32 outward while resisting the spring force by the plate spring 33, and stops when the ball 31 of the clamp shaft 32 is set in the V-shaped groove 30. The absorption nozzle 6 (7) is readily removed if it is pulled by such a force as to be able to push the ball 31 of the clamp shaft 32 out of the V-shaped groove 30.

Figure 10:
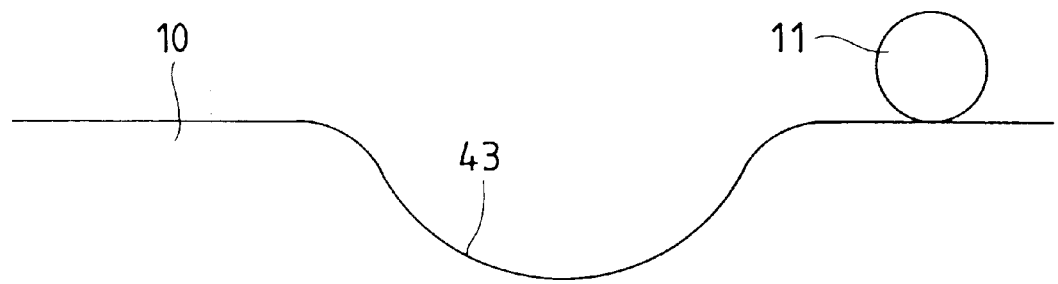
FIG. 10 is a partly developed view of a cam.

The cam means 4 includes a cylindrical cam 10 rotating around the S-Z shaft 1, a cam roller 11 rolling on the cylindrical cam 10, and a roller support block 12 for transmitting a displacement of the cam roller 11 to the Z-shaft 3. As shown in FIG. 10, only one incurved part 43 for providing a displacement is formed in the cylindrical cam 10. Only the Z-shaft 3, which is coupled with the cam roller 11 placed in the incurved part 43, is made to descend toward the mounted surface 23 or the part supply means such as a tape feeder. The quantity of the displacement of the Z-shaft 3, caused by the incurved part 43, suffices for adjusting the absorption nozzle 6 to the level of the absorption nozzle 7 of the S-Z shaft 1. The cylindrical cam 10, fastened to a timing pulley 13, revolves freely around the arm member 2. The timing pulley 13 is rotatably supported by the arm member 2, which supports the Z-shaft 3, with a bearing 14 intervening therebetween. With this structure, when the rotation of a motor 42 is transmitted to the timing pulley 13 by way of the timing belt, the cylindrical cam 10 rotates to vertically move any Z-shaft 3 separately. The original position of the cylindrical cam 10 is detected by the combination of an original position sensor 54 and a detecting plate 55.

Figure 5:
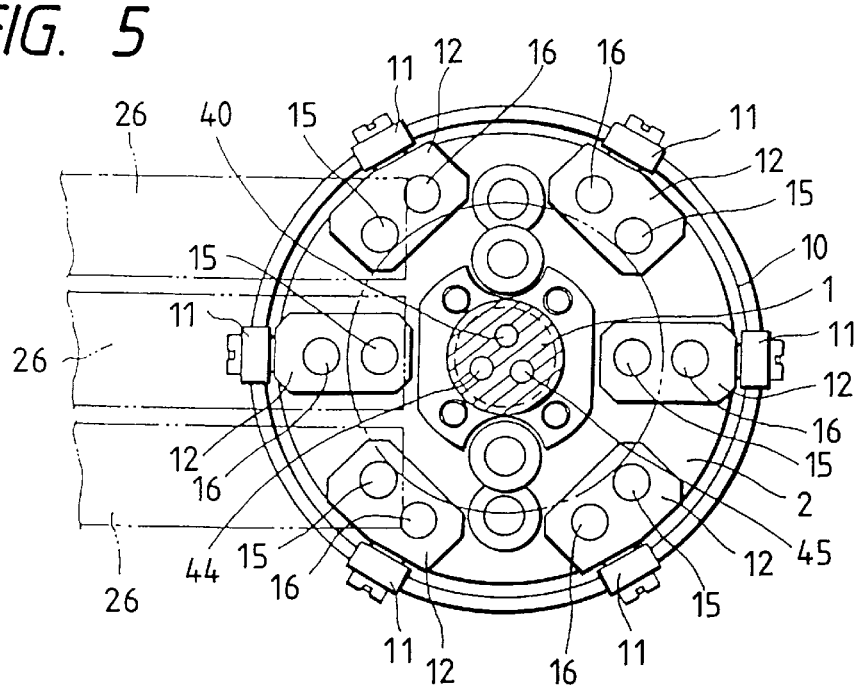
FIG. 5 is a plan view taken on line V—V in FIG. 1, showing an arrangement of the Z-shafts.
Figure 6:
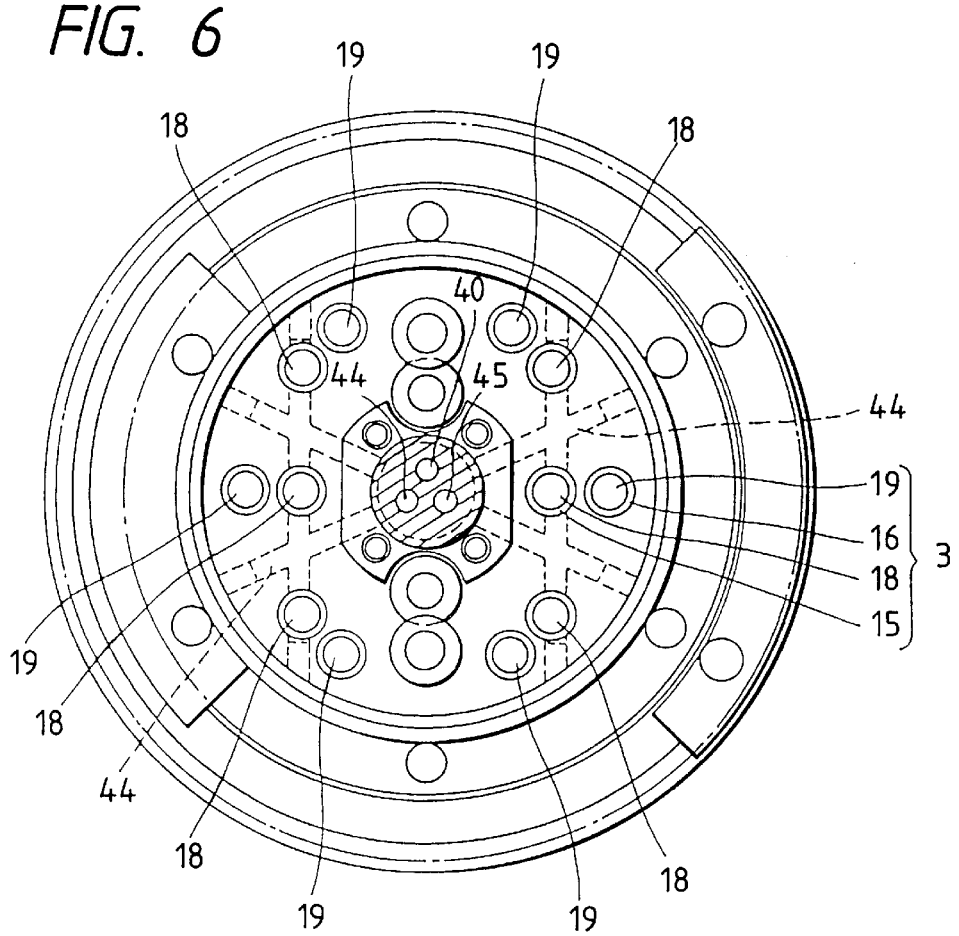
FIG. 6 is a plan view showing an arm member, and a relationship between the first shaft for connecting the absorption nozzle of the Z-shaft, and the path.

The Z-shaft 3 includes a first shaft 15 with the absorption nozzle 6 attached to the lower end thereof, and a second shaft 16 disposed in parallel with the first shaft 15. The first and the second shaft 15 and 16 are both supported by the arm member 2 so that these shafts are slidable in the direction vertical to the mounted surface 23 of the printed circuit board 24 (not shown). Although not shown, if the shafts 15 and 16 are guided by ball bush means or the like as the supporting method, the rigidity thereof and the position accuracy are improved. A resilient means 17, such as a compressed coiled spring or a gas spring, is inserted between arm member 2 and the first shaft 15 and between the arm member and the second shaft 16, constantly urging these shafts 15 and 16 downward. A fluid pressure actuator may be used for the same purpose, as a matter of course. Alternatively, the Z-shafts 3 are constantly pushed up by a resilient means such as a coiled spring, while only the corresponding Z shaft may be pushed down by a cam means. Thus, the Z-shaft 3 consisting of the first and the second shafts 15 and 16 vertically reciprocates along the cam surface of the cylindrical cam 10, viz., in the direction vertical to the mounted surface 23. As shown in FIG. 5 or 6, among the first shafts 15 to which the absorption nozzles 6 are attached, three first shafts are arrayed along a line and three other first shafts are arrayed along a line parallel to the former line, the two lines being symmetrical with respect to the S-Z shaft 1. The second shafts 16 are positioned and the roller support blocks 12 are shaped so that those are placed on the circumference within the cylindrical cam 10.

In each Z-shaft 3, air paths 18 and 19 selectively communicating with the first and the second pressure source 20 and 21 are formed, and the select means 8 is provided. The select means 8 is operated by the vertical movement of the Z-shaft 3. When the absorption nozzle 6 of the Z-shaft 3 is used, the opening ends of the air paths 18 and 19 are selectively positioned in a ring-like groove 9a, which communicates with the first pressure source 20 operating always in a negative pressure mode, and a ring-like groove 9b, which communicates with the second pressure source 21 operating in any of the following: a positive pressure mode, an off mode, and a negative pressure mode.

In this embodiment, the air paths 18 and 19 communicating with the absorption nozzle 6 are formed in the first and the second shaft 15 and 16. The air path 18 is connected to the first pressure source 20 (i.e., a negative pressure source), which operates always in the negative pressure mode. The air path 19 is connected to the second pressure source 21, the operation mode of which may be switched from the positive mode to the negative mode and vice versa. The opening ends of the air paths 18 and 19 are positioned so that when the air path 18 of the first shaft 15 is connected to the first pressure source 20, the air path 19 of the second shaft 16 is disconnected from the second pressure source 21, and when the air path 19 of the second shaft 16 is connected to the second pressure source 21, the air path 18 of the first shaft 15 is disconnected from the first pressure source 20. The air path 18 and the air path 19 are interconnected at the first ends thereof by an interconnection path 22. With this construction, when the Z-shaft 3 approaches to the mounted surface 23 or the part supply means 26, viz., the Z-shaft 3 descends to mount a mounted part or to attract a mounted part by absorption, the air path 18 is disconnected from the first pressure source 20, and only the air path 19 is connected to the second pressure source 21. Accordingly, the work for mounting or attracting the mounted part 25 can be performed when only the second pressure source 21 is switched to the negative pressure source or the positive pressure source.

Figure 7:
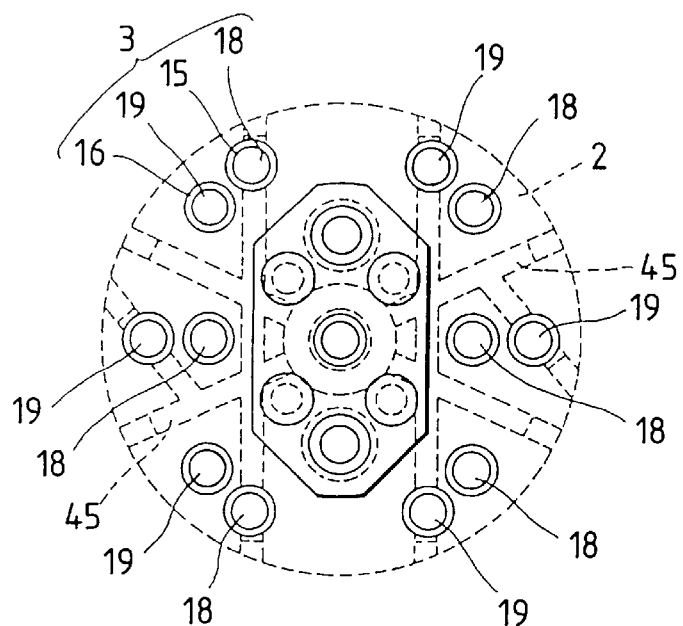
FIG. 7 is an explanatory diagram showing the relationship between the second shaft of the Z-shaft and the path.

The air paths 18 and 19 are connected to the first and the second pressure source 20 and 21 by interconnection paths 44 and 45, which pass through the S-Z shaft 1 and the arm member 2, as shown in FIGS. 6 and 7. As shown in FIG. 6, a total of six first shafts 15, three of the first shafts 15 located on the right side and another three of the first shafts 15 on the left side, are interconnected by the first path 44, and connected to the first pressure source 20 through the port 46 of the holder 36. As shown in FIG. 7, a total of six second shafts 16, three of the second shafts 16 located on the right side and another three of the second shafts 16 on the left side, are interconnected by the second path 45, and connected to the first second pressure source 21 through the port 47 of the holder 36. A third path 40, which is opened, not plugged, is axially formed in the S-Z shaft 1. The third path 40 is connected through the port 48 to the third pressure source 39, and communicates with the nozzle holder 27, which supports the absorption nozzle 7 at the lower end of the S-Z shaft 1. With this construction, the absorption nozzle 7 attracts or mounts a mounted part 25 by switching the operation mode of the third pressure source 39 to the negative pressure mode or the positive pressure mode. The third pressure source 39 is always put in the off mode when the absorption nozzle 7 is not used.

Figure 9:
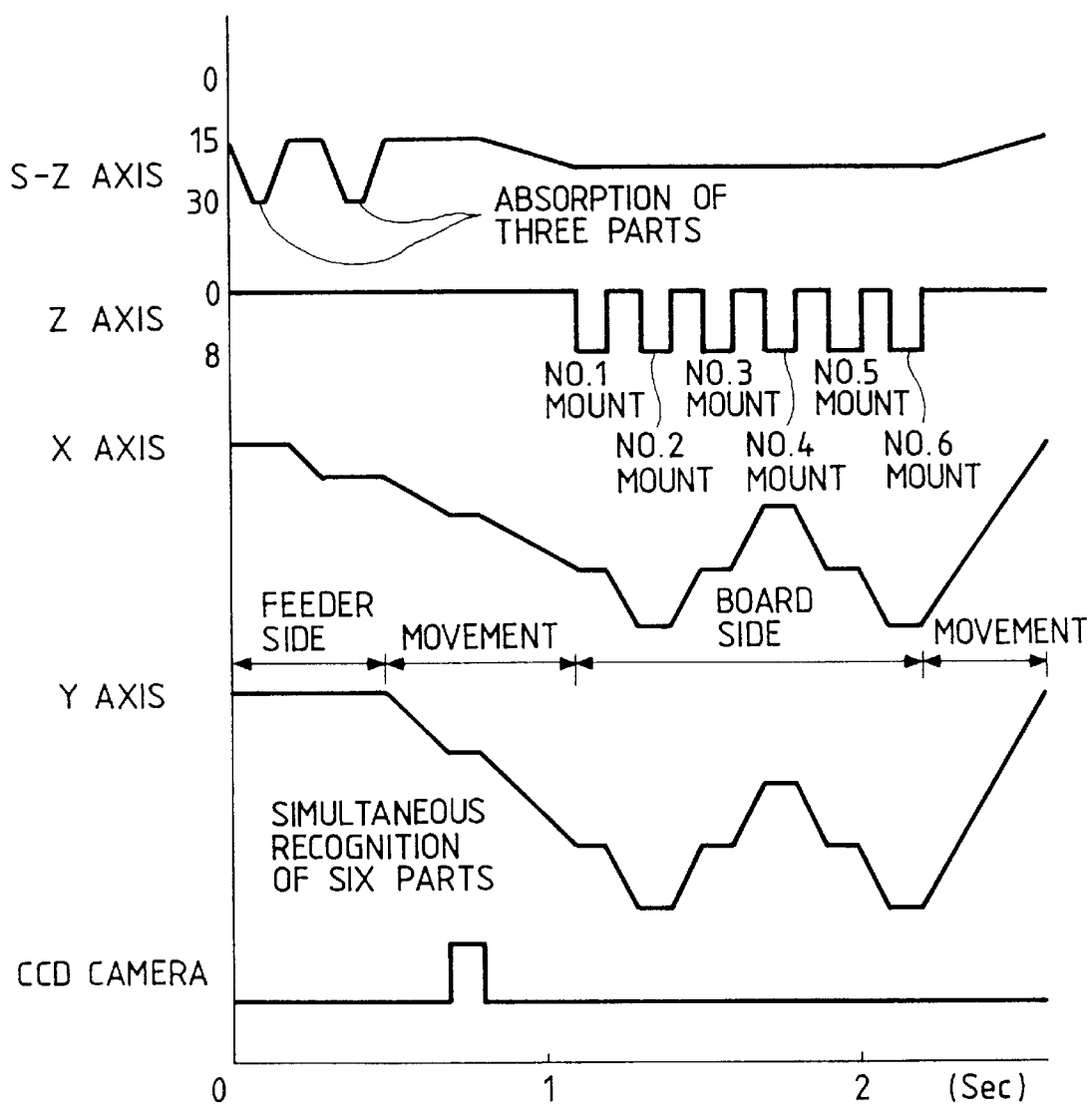
FIG. 9 is a timing chart showing the mounting work by a mounter head.

The electronic-part surface mounting apparatus thus constructed operates for attracting and mounting a mounted part such as an electronic part in the following ways.
Attraction/mounting work by the Z-shafts A simultaneous attraction work, a single attraction work, and a mounting work by using a total of six Z-shafts 3 will be described. In this case, the absorption nozzle 7 of the S-Z shaft is removed so as to interrupt those attraction and mounting work. The third pressure source 39 is always left off.
Simultaneous Attraction Work The simultaneous attraction work, as shown in FIG. 9, for example, is carried out two times; in the first work, the three Z-shafts 3 attract three mounted parts 25 by absorption, and in the second work the remaining three Z-shafts attract three mounted parts 25. This will be described in detail. The three Z-shafts 3 tangentially arrayed are moved to the part pick-up positions of the part supply means 26, such as tape feeders, arranged in three lines, by the rotation of the arm member 2. At this time, the first pressure source 20 is put in the negative pressure mode, and the absorption nozzles 6 communicated with the air path 18 are put in an attraction mode only when the Z-shafts are lifted. At this time, the second pressure source 21 is in an off mode. Accordingly, the six absorption nozzles 6 descend with the descending operation of the S-Z shaft 1, and the three absorption nozzles 6 simultaneously attract mounted parts 25 from the tape feeders since those communicate with the first pressure source 20 through the first air path 18.

Thereafter, the S-Z shaft 1 is temporarily lifted, and then half-turned (180°), and the remaining three Z-shafts 3 are moved to the part pick-up positions of the part supply means. As in the previous case, the S-Z shaft 1 is made to descend to cause the ascending absorption nozzles 6 of the three Z-shafts 3 to attract mounted parts 25 simultaneously. Subsequently, the mounted parts 25 are picked up from the part supply means 26 through the ascending motion of the S-Z shaft 1.
Single Attraction Work In the single attraction work, the Z-shafts 3 are vertically moved one by one for attracting mounted parts. In a state where all the Z-shafts 3 have been lifted, these descend to the level to which the S-Z shaft 1 descends when it mounts the mounted part with the absorption nozzle 7. Then, the motor 50 is driven to turn the arm member 2, which in turn moves the Z-shafts 3 not yet attracting mounted parts 25 to the part pick-up positions of the part supply means 26 (e.g., tape feeders). At this time, the first and the second power source 20 and 21 are both put in the negative pressure mode. In this state, the absorption nozzles 6 are put in an attraction mode even if any of the air paths 18 and 19 of the first and the second shaft 15 and 16 is connected to the pressure sources. At this time, the third pressure source 39 of the absorption nozzle 7 is in an off mode. Accordingly, if one Z-shaft 3 descends as the result of rotation of the cylindrical cam 10 or the arm member 2, the absorption nozzle 6 attached to the lower end thereof communicates with the second pressure source 21 through the second air path 19, to thereby attract a mounted part 25 from the tape feeder. As a result of the ascending of the Z-shaft 3, the absorption nozzle 6 is connected to the first pressure source 20. At this time, the first pressure source 20 is also in the negative pressure mode. Then, it continuously attracts the mounted part 25. After the part attraction, the arm member 2 is turned to move another Z-shaft to the part pick-up position of the tape feeder. Subsequently, it attracts one mounted part as in the previous case.

Mounting Work

When mounted parts 25 are attracted by all the Z-shafts 3, the positions of the six mounted parts 25 are simultaneously recognized by one CCD camera. The inner area of a rectangular, of which an inscribed circle or a circumcircle is the circumferential surface of the cylindrical cam 10, is substantially the coverage of the CCD camera. A part of the inner area, i.e., a predetermined area about the absorption nozzle 6 or 7, is an image processing area actually required.

After the positions of the mounted parts 25 are recognized, a mounter head is moved to a predetermined position on the mounted surface 23 of the printed circuit board 24, and descends to the level where the S-Z shaft 1 descends to mount the mounted part by the absorption nozzle 7. When the first Z-shaft 3 of No. 1 is positioned at a place on the printed circuit board 24 where the mounted part is to be mounted on, the cylindrical cam 10 is rotated by the timing pulley 13 of the cam means 4, the incurved part 43 is located at the place of the corresponding Z-shaft 3, the Z-shafts 3 are individually driven, and are caused to descend toward the mounted surface 23 by the resilient means 17. At this time, at a position where the mounted part 25 attracted by the absorption nozzles 6 comes near to the mounted surface 23, the first air path 18 is closed, and the absorption nozzles 6 is switched from the first pressure source 20 to the second pressure source 21 through the second air path 19. At the time of the switching, it temporarily communicates with both the first and the second pressure source 20 and 21. However, it is more forcibly coupled with the first pressure source 20 than with the second pressure source 21. Accordingly, the mounted part will never be detached from the absorption nozzles 6. The operation mode of the second pressure source 21 is switched to the positive pressure mode while the mounter head is moving. With the descending of the Z-shaft 3, the vacuum of the attraction/mounting means 5 of the Z-shaft 3 connected to the second pressure source 21 is removed, and a positive pressure is applied. Accordingly, the mounted part 25 is mounted at a desired location on the mounted surface 23. In this way, the mounted parts 25 attracted and held by the first to sixth Z-shafts 3 of No. 1–No. 6 are successively mounted on predetermined locations on the mounted surface 23. After all the mounted parts are mounted, the S-Z shaft 1 ascends and the mounter head is moved in the X and Y directions, and is ready for the next part mounting work.

Attraction/Mounting Work by the S-Z Shaft

A work for attracting and mounting a mounted part by using the absorption nozzle 7 of the S-Z shaft 1 will be described. This attraction/mounting work by the S-Z shaft is preferably used for handling relatively large mounted parts. To this end, the absorption nozzle 7 is designed to have a larger attraction force than the absorption nozzles 6. The absorption nozzles 6 may be removed or retracted upward from the position of the absorption nozzle 7. The first and the second pressure source 20 and 21 are always in an off mode. In the description to follow, the absorption nozzles 6 are left attached to the Z-shafts 3.

Attraction Work by Absorption

After all the Z-shafts 3 are lifted, the S-Z shaft 1 is moved to the part pick-up position of the part supply means 26, for example, a tray. The S-Z shaft 1 is moved down to the level where the mounted part will be mounted with the absorption nozzle 7, under control by a controller (not shown). The quantity of the drop is the same as that in the case of the Z-shaft. At this time, the third pressure source 39 is placed to the negative pressure mode, and the absorption nozzle 7 is operated for absorption. The selection of operation modes, a negative pressure mode, an off mode, and a positive pressure mode, of the third pressure source 39, is performed by using a valve etc. not shown. The third pressure source 39 is placed to the negative operation mode, except that the S-Z shaft 1 is moved down for mounting the mounted part. Accordingly, the mounted part 25 is left attracted by absorption. When a mounted part 25 is attracted by the S-Z shaft 1, an image recognition means, such as a CCD camera, recognizes the positions of the mounted part 25 and the printed circuit board 24.

Mounting Work

After the position recognition, the mounter head is moved to a predetermined position on the mounted surface 23 of the printed circuit board 24, and descends to the level where the S-Z shaft 1 descends to mount the mounted part by the absorption nozzle 7. At this time, at a position where the mounted part 25 attracted by the absorption nozzles 6 comes near to the mounted surface 23, the third pressure source 39 is switched from the negative pressure mode to the positive pressure mode, the absorption nozzle 7 releases the mounted part 25, so that it is mounted at a predetermined position on the printed circuit board 24.

While there has been described what is at present considered to be the preferred embodiment of the present invention, it should be understood that the present invention may variously be modified, changed and altered within the scope of the present invention. For example, where there is no need of simultaneously attracting electronic parts, the following modification is allowed: the Z-shafts 3 are equidistantly and concentrically arranged around the S-Z shaft 1, and these are selectively operated to attract an electronic part. This modification can also have the benefit of the machine size reduction.

Modification

In the above-mentioned embodiment, the absorption nozzles 6 are vertically moved together with the first shafts 15. Accordingly, the height of the mounted part 25 determines the level of the lower end of the first shaft 15 when it descends, so that an intended connection to the pressure source sometimes does not take place.

Further, there is a possibility that when the absorption nozzle 6 comes in contact with the mounted part 25 by its absorptive attraction, the mounted part is damaged by impact. To avoid this part damaging problem, there is a limit in increasing the resiliency of the resilient means 17, so that there is also a limit in increasing the rotation speed of the cylindrical cam 10 in view of operation followability. Consequently, increase of the mounting speed of the machine is also limited.

Figure 11A:
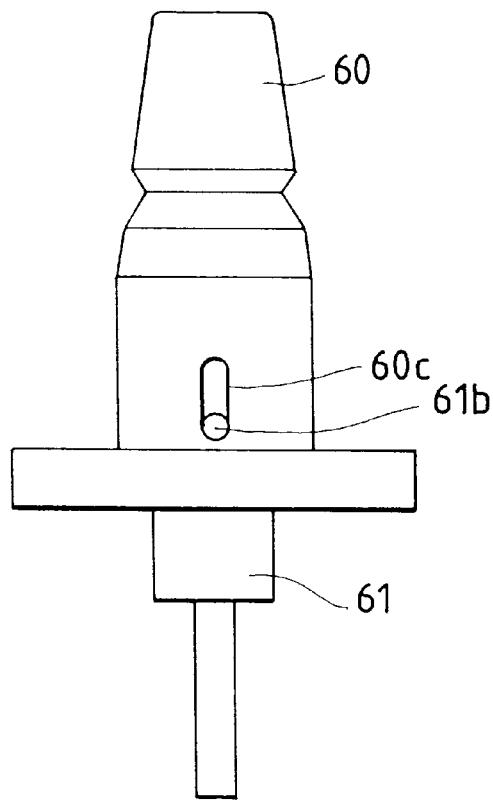
FIG. 11(A) is a front view showing a modification of the absorption nozzle.
Figure 11B:
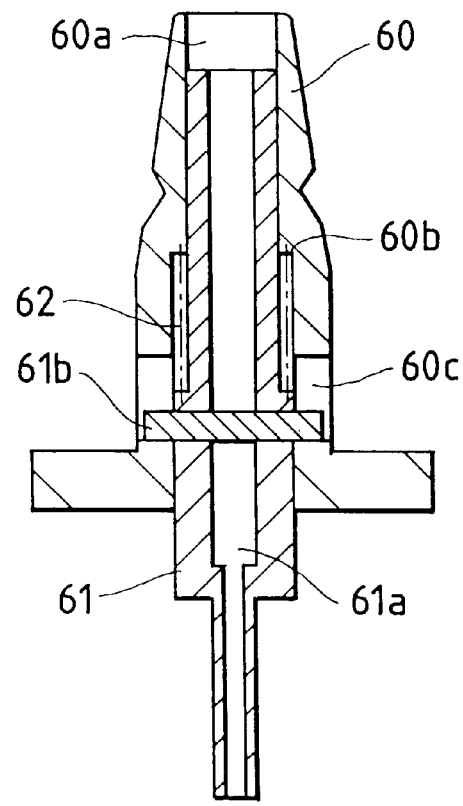
FIG. 11(B) is a cross sectional view of the absorption nozzle of FIG. 11(A).

The problem can be solved by a structure of the absorption nozzle 6 as shown in FIGS. 11(A) and 11(B).

An absorption nozzle body 60 includes a center hole 60a, a spring receiving stepped part 60b, and an elongated hole 60c vertically arranged. A nozzle 61 is slidably inserted into the center hole 60a. A spring 62 constantly urges the nozzle 61 inserted therein downward. A horizontal shaft 61b is press fit into the nozzle, and into the elongated hole 60c, thereby locking the nozzle in the vertical movement. An air path is designated by reference numeral 61a. The spring 62 is weaker than the resilient means 17, and preferably has such a resiliency as not to damage the mounted part 25 when the nozzle 61 is brought into contact with the mounted part 25.

In operation, with rotation of the cylindrical cam 10, the first and the second shaft 15 and 16 descend. During the course of the descending of the shafts, when the nozzle 61 comes in contact with the mounted part 25, it stops and the spring 62 is compressed to cause the shafts 15 and 16 to descend a predetermined distance. Under this condition, an intended part attracting operation is performed.

The operation of mounting a mounted part is also performed in a similar way. The nonuniformity of the height of mounted parts can be absorbed by the spring 62. The present modification is free from the part damaging problem, and increase of the resiliency of the resilient means 17 is allowed. Thus, the rotation speed of the cylindrical cam 10 can be increased, and the mounting speed of the machine can be also increased. Further, where the absorption nozzle 7 is thus structured, it may be always left attached to the S-Z shaft.

As seen from the foregoing description, an electronic part surface mounting apparatus comprises: an S-Z shaft vertically movable with respect to a mounted surface and rotatable in a plane parallel to the mounted surface; an arm member revolving around the S-Z shaft; a plural number of Z-shafts, supported by the arm member, being vertically movable with respect to the mounted surface; cam means revolving around the Z-shafts to cause the Z-shafts to individually move in a reciprocating manner; attraction/mounting means operating such that at a position where the Z-shafts come nearest to the mounted surface, the attraction/mounting means releases the mounted part from its seizure by the absorption nozzle attached to the lower end of the Z-shaft, and mounts the mounted part on the mounted surface. Thus, with one cycle of the cam means, a plural number of Z-shafts descend and ascend, so that the attracting and mounting work of the mounted part are successively carried out, thereby reducing their tact time.

Further, the spatial interval between the Z-shafts of the Z-shaft array can be set to be equal to that between the part supply means arrayed side by side. Accordingly, a plural number of mounted parts can simultaneously be attracted from the part supply means. Further, the area where all the Z-shafts are arrayed can be within the size of an image picked up by one camera. Therefore, the positions of all the mounted parts attracted by the absorption nozzles can be recognized by one camera. The simultaneous attraction and position recognition of all the mounted parts reduce the quantity of the operation and hence the tack time for the mounting of the mounted parts can be reduced. Particularly, in the invention, two linear arrays of Z-shafts are arranged in parallel to each other, and by turning the S-Z shaft 180°, one group of the absorption nozzles are exchanged with another group. Thus, it is easy to simultaneously pick up the mounted parts.

Further, since the vacuum of the absorption nozzle is mechanically removed with the movement of each of the Z-shafts, no time delay is caused although it is caused when a solenoid valve is used for the vacuum removal. The result is reduction of the tack time.

Further, when a relatively large mounted part must accurately be mounted, the mounted part may be mounted by only the absorption nozzle at the lower end of the S-Z shaft and by directly controlling the nozzle. In this case, the Z-shafts are lifted or the absorption nozzles are removed.

While the foregoing description and drawings represent the preferred embodiments of the present invention, it will be obvious to those skilled in the art that various changes and modifications may be made therein without departing from the true spirit and scope of the present invention.

What is claimed is:

1. An electronic-part surface mounting apparatus, comprising:

an S-Z shaft vertically movable with respect to a mounted surface of a printed circuit board and rotatable in a plane parallel to said mounted surface;

an arm member revolving around said S-Z shaft;

a plural number of Z shafts, supported by said arm member, being vertically movable with respect to said mounted surface;

cam means revolving around said Z shafts to cause said Z shafts to individually move in a reciprocating manner;

an absorption nozzle attached to a lower end of each of said Z shafts; and attraction/mounting means operating such that at a position where said Z shafts come near to said mounted surface, said attraction/mounting means releases a mounted part from its seizure by said absorption nozzle, and mounts said mounted part on said mounted surface, said attraction/mounting means including:

a negative pressure source being operable in a negative pressure mode; and a selective pressure source being selectively operable in the negative pressure mode and a positive pressure mode;

wherein said Z shafts are selectively connected to said negative pressure source and said selective pressure source in accordance with a reciprocating movement of said shafts such that said Z shafts are connected to said negative pressure source when said Z shafts are moved apart from said mounted surface and is connected to said selective pressure source when said Z shafts come near said mounted surface, said selective pressure source being switched from said negative pressure mode to said positive pressure mode while said Z shafts are moved apart from said mounting surface to be connected to said negative pressure source so that a vacuum state of said Z shafts is removed to mount said mounted part.

2. An electronic-part surface mounting apparatus comprising:

an S-Z shaft vertically movable with respect to a mounted surface of a printed circuit board and rotatable in a plane parallel to said mounted surface;

an arm member revolving around said S-Z shaft;

a plural number of Z shafts, supported by said arm member, being vertically movable with respect to said mounted surface;

cam means revolving around said Z shafts to cause said Z shafts to individually move in a reciprocating manner;

an absorption nozzle attached to a lower end of each of said Z shafts; and attraction/mounting means operating such that at a position where said Z shafts come near to said mounted surface, said attraction/mounting means releases a mounted part from its seizure by said absorption nozzle, and mounts said mounted part on said mounted surface; and an absorption nozzle removably attached to said S-Z shaft and being operable in an absorption mode or a part mounting mode, said absorption nozzle being switched from said absorption mode to said part mounting mode and vice versa by a vertical movement of said S-Z shaft.

3. The electronic-part surface mounting apparatus according to claim 2, wherein said absorption nozzle attached to said S-Z shaft includes a nozzle body by which said absorption nozzle is attached to said S-Z shaft; and a nozzle being slidable in said nozzle body and urged downward.

4. The electronic-part surface mounting apparatus according to claim 3, wherein said nozzle body is fixed to said S-Z shaft.

5. The electronic-part surface mounting apparatus according to claim 2, wherein an end of said absorption nozzle attached to said S-Z shaft protrudes more downward than an end of said absorption nozzle attached to said Z shafts.

6. The electronic-part surface mounting apparatus according to claim 5, wherein an amount of protrusion of said absorption nozzle attached to said S-Z shaft coincides with an amount of variation of said absorption nozzle attached to said Z shafts moved by said cam means.

7. The electronic-part surface mounting apparatus according to claim 3, wherein an end of said absorption nozzle attached to said S-Z shaft protrudes more downward than an end of said absorption nozzle attached to said Z shafts.

8. The electronic-part surface mounting apparatus according to claim 7, wherein an amount of protrusion of said absorption nozzle attached to said S-Z shaft coincides with an amount of variation of said absorption nozzle attached to said Z shafts moved by said cam means.

* * * * *